US009099982B2

(12) United States Patent
Adkisson et al.

(10) Patent No.: US 9,099,982 B2
(45) Date of Patent: Aug. 4, 2015

(54) METHOD OF MANUFACTURING SWITCHING FILTERS AND DESIGN STRUCTURES

(75) Inventors: James W. Adkisson, Jericho, VT (US); Panglijen Candra, Williston City, VT (US); Thomas J. Dunbar, Burlington, VT (US); Jeffrey P. Gambino, Westford, VT (US); Mark D. Jaffe, Shelburne, VT (US); Anthony K. Stamper, Williston, VT (US); Randy L. Wolf, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 551 days.

(21) Appl. No.: 13/358,172

(22) Filed: Jan. 25, 2012

(65) Prior Publication Data
US 2013/0187729 A1    Jul. 25, 2013

(51) Int. Cl.
*H03H 3/08* (2006.01)
*H01L 41/08* (2006.01)
(Continued)

(52) U.S. Cl.
CPC ............... *H03H 3/08* (2013.01); *H01L 41/08* (2013.01); *H03H 9/64* (2013.01); *H03H 9/6403* (2013.01); *H03H 9/6413* (2013.01); *H03H 2003/0071* (2013.01); *H03H 2009/02299* (2013.01); *Y10T 29/42* (2015.01); *Y10T 29/49005* (2015.01);
(Continued)

(58) Field of Classification Search
CPC ............ H03H 3/08; H03H 2003/0071; H03H 2009/02299; H03H 9/64; H03H 9/6413; H03H 9/6403; H01L 41/08; Y10T 29/42; Y10T 29/49005; Y10T 29/49126; Y10T 29/49147; Y10T 29/49155
USPC ......... 29/25.35, 594, 830, 842, 846; 333/186, 333/187, 189, 193, 197
See application file for complete search history.

(56) References Cited

U.S. PATENT DOCUMENTS 5,163,220 A * 11/1992 Zeto et al. ................... 29/846
5,455,547 A * 10/1995 Lin et al. .................... 333/186
(Continued)

FOREIGN PATENT DOCUMENTS

CN           1160308 A      9/1997
DE    102005027457 A1    12/2006
(Continued)

OTHER PUBLICATIONS

"Patent Translate", Machine Translation (English) of DE 10 2005 027 457, Mar. 2015.*
(Continued)

*Primary Examiner* — A. Dexter Tugbang
(74) *Attorney, Agent, or Firm* — Anthony Canale; Roberts Mlotkowski Safran & Cole, P.C.

(57) ABSTRACT

Switchable and/or tunable filters, methods of manufacture and design structures are provided herein. The method of forming the filters includes forming at least one piezoelectric filter structure comprising a plurality of electrodes formed on a piezoelectric substrate. The method further includes forming a fixed electrode with a plurality of fingers on the piezoelectric substrate. The method further includes forming a moveable electrode with a plurality of fingers over the piezoelectric substrate. The method further includes forming actuators aligned with one or more of the plurality of fingers of the moveable electrode.

18 Claims, 4 Drawing Sheets

(51) Int. Cl.
  *H03H 9/64*   (2006.01)
  *H03H 3/007*  (2006.01)
  *H03H 9/02*   (2006.01)

(52) U.S. Cl.
  CPC ...... *Y10T 29/49126* (2015.01); *Y10T 29/49147* (2015.01); *Y10T 29/49155* (2015.01)

(56) References Cited

U.S. PATENT DOCUMENTS

| | | | |
|---|---|---|---|
| 6,621,134 B1 * | 9/2003 | Zurn | ............... 333/197 X |
| 6,703,763 B2 | 3/2004 | Tsai et al. | |
| 7,098,575 B2 | 8/2006 | Mehta | |
| 7,218,188 B2 | 5/2007 | Ma et al. | |
| 7,514,759 B1 | 4/2009 | Mehta et al. | |
| 2009/0108381 A1 * | 4/2009 | Buchwalter et al. | ...... 333/186 X |
| 2011/0012696 A1 | 1/2011 | Skarp | |

FOREIGN PATENT DOCUMENTS

| | | | |
|---|---|---|---|
| JP | 60250710 A | | 12/1985 |
| JP | 2006093463 A | * | 4/2006 |
| WO | 2004008635 A1 | | 1/2004 |

OTHER PUBLICATIONS

P. Ancey "Above IC RF MEMS and BAW filters: fact or fiction?", Bipolar/BiCMOS Circuits and Technology Meeting, 2006, Digital Object Identifier: 10.1109/BIPOL.2006.311142, Publication Year: 2006 , pp. 1-5.

J.H. Kuypers et al. "Phase Velocity Control of Surface Acoustic Waves Based on Surface Shorting and Electrical Field Application Using MEMS Switches", Ultrasonics Symposium, 2007, IEEE, Digital Object Identifier: 10.1109/ULTSYM.2007.310, Publication Year: 2007 , pp. 1233-1238.

W. Pang et al. "Electrically tunable and switchable film bulk acoustic resonator", IEEE International, Ferroelectrics and Frequency Control Symposium and Exposition, 2004, pp. 22-26.

M. Miyashita et al. "A surface acoustic wave dynamics control device by grating structure", Micro Electro Mechanical Systems, 2008. MEMS 2008, pp. 661-664.

J.L. Pornin et al. "Wafer Level Thin Film Encapsulation for BAW RF MEMS", Electronic Components and Technology Conference, 2007. ECTC '07. Proceedings. 57th; Publication Year: 2007 , pp. 605-609, Digital Object Identifier: 10.1109/ECTC.2007.373858.

J. Petsinger et al. "Tunable Inductor and Thin Film Resonator Filter with Adjustable Bandwidth", Motorola TDB; Nov. 18, 2002, 4 pages.

J. Lim et al. "An Ultra Small SAW RF Filter Using Wafer Level Packaging Technology", Samsung Advanced Institute of Technology, Korea, 2006 IEEE Ultrasonics Symposium, pp. 196-199.

Response filed in the related U.K. Patent Application No. 1300243.1 dated Jan. 27, 2014, 6 pages.

Office Action for related DE application 102013200215.7 dated Oct. 24, 2014, 8 pages.

Examination Report for related GB Application No. GB1300243.1 dated Apr. 14, 2015, 2 pages.

* cited by examiner

US 9,099,982 B2

METHOD OF MANUFACTURING SWITCHING FILTERS AND DESIGN STRUCTURES

FIELD OF THE INVENTION

The invention relates to semiconductor structures and methods of manufacture and, more particularly, to switchable and/or tunable filters, methods of manufacture and design structures.

BACKGROUND

SAW (surface acoustic wave) filters play a key role in telecommunications. For example, SAW filters are widely used as bandpass and spectrum-shaping filters in mobile and wireless applications. Other applications for SAW filters include wide area networks (WAN), wireless local area network (WLAN) communications, cordless phones, pagers and satellite communications. SAW filters are preferable to conventional LC filters as they are much smaller, cheaper and more versatile, making them ideal for telecommunication applications.

In SAW filters, electrical signals are converted to a mechanical wave in a device constructed of a piezoelectric crystal or ceramic. The wave is delayed as it propagates across the device, before being converted back to an electrical signal by other electrodes. More specifically, coupling between surface waves and electrical signals is achieved by interdigital transducers (IDTs). A simple form of the IDT consists of parallel fingers alternately connected to opposite electrodes to which the signal is applied.

For example, when an AC voltage is applied to input transducers, due to piezoelectricity, the transducer produces mechanical deformation of the piezoelectric substrate surface. This, in turn, results in a surface acoustic wave traveling on the surface of the piezoelectric substrate until reaching the output IDT, where it is transformed back to an electrical signal. When this wave reaches the output IDT, the electric field will induce a potential difference between neighboring electrodes such that the output IDT will convert the mechanical vibration into output voltages.

SAW filters can be designed to provide quite complex signal processing functions within a single package containing only a piezoelectric substrate with superimposed thin metal film input and output interdigital transducers (IDTs). SAW filters can be mass-produced using semiconductor microfabrication techniques, which enables reproducibility of the SAW filters. However, programming or tuning of the SAW filters has been found to be difficult to achieve.

Accordingly, there exists a need in the art to overcome the deficiencies and limitations described hereinabove.

SUMMARY

In a first aspect of the invention, a method comprises forming at least one piezoelectric filter structure comprising a plurality of electrodes formed on a piezoelectric substrate. The method further comprises forming a fixed electrode with a plurality of fingers on the piezoelectric substrate. The method further comprises forming a moveable electrode with a plurality of fingers over the piezoelectric substrate. The method further comprises forming actuators aligned with one or more of the plurality of fingers of the moveable electrode.

In another aspect of the invention, a filter comprises at least one filter comprising a plurality of electrodes formed on a piezoelectric substrate. The plurality of electrodes include a moveable electrode and a fixed electrode both with a plurality of fingers that are positioned to be interleaved with one another in an on state.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the switchable filter structures, which comprises the structures of the present invention. In still further embodiments, a method in a computer-aided design system is provided for generating a functional design model of the switchable filter structures. The method comprises generating a functional representation of the structural elements of the tunable filter structures.

More specifically, in embodiments, a method is provided in a computer-aided design system for generating a functional design model of a switchable filter structure. The method comprises generating a functional representation of a plurality of electrodes formed on a piezoelectric substrate, wherein the plurality of electrodes include a moveable electrode and a fixed electrode both with a plurality of fingers that are positioned to be interleaved with one another in an on state.

In an additional aspect of the invention, a method comprises determining a frequency of a filter or need to have the filter activated, and electro-statically moving a moveable electrode of the filter by applying a drive voltage to at least one actuator in order to one of activate and deactivate the filter, in response to the determining.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention. Unless otherwise specified herein, the drawings are not to scale.

DETAILED DESCRIPTION

Figure 1:
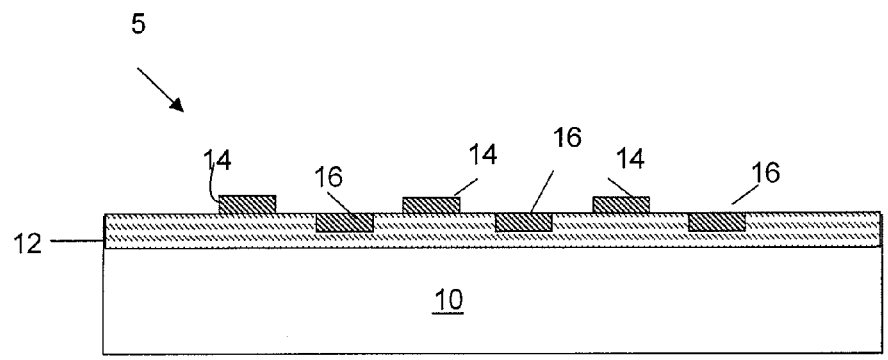
FIGS. 1-6 show fabrication processes and respective structures for fabricating a switchable filter structure in accordance with aspects of the present invention.

The invention relates to semiconductor structures and methods of manufacture and, more particularly, to switchable and/or tunable filters, methods of manufacture and design structures. In embodiments, the switchable and/or tunable filter structures of the present invention include, for example, Surface Acoustic Waver (SAW) filters. In embodiments, the filter structures of the present invention are capable of being switchable between an "on" state and an "off" state using, for example, a moveable ground electrode. Alternatively, in a multiple SAW filter application, the moveable ground electrode can tune the filter to a desired frequency by turning "off" or "on" selected SAW filters.

More specifically, the SAW filter of the present invention includes interdigitized or interleaved electrodes formed on the piezoelectric substrate. The piezoelectric material can be, for example, aluminum nitride or zinc oxide; although other piezoelectric materials are also contemplated by the present invention. In embodiments, the interleaved electrodes of the SAW filter include a ground electrode interleaved with either a Vin electrode or Vout electrode to form input and output IDTs, respectively. Depending on the selected harmonic frequencies, the input IDT and output IDT can be spaced apart from one another by various distances, or provided in a series configuration, amongst two or more SAW filter structures.

In embodiments, the SAW filter (or any of a multitude of SAW filters) of the present invention can be turned "on" and "off" by a moveable ground electrode. Alternatively, the ground electrode can be stationary and the Vin or Vout electrode can be moveable. In embodiments, actuators can be placed above and below some or all of the fingers of the moveable electrode (e.g., ground electrode) in order to electro-statically move the fingers of the moveable electrode (e.g., ground electrode) up or down. In this way, the moveable electrode (e.g., ground electrode) can move into the same plane as the stationary electrode, (e.g., Vin electrode (or Vout electrode)) in order to allow a signal (voltage) to pass between the ground electrode and the Vin electrode or Vout electrode of the Vin IDT or Vout IDT, depending on the configuration of the structure.

By being in the same plane or substantially the same plane, a wave can be propagated along the piezoelectric substrate from the Vin IDT to the Vout IDT, where it will be converted back into a signal. In embodiments, the moveable electrode can move out of the same plane as the stationary electrode (e.g., Vin electrode or Vout electrode) which would, in embodiments, reduce waves below a detectable threshold. Advantageously, the moveable electrode will not add any series resistance, nor will it decrease the effective Q of the filter (compared to using a FET switch to bypass the filter).

Hereinafter, the description will focus on moveable ground electrodes; however, one of skill in the art should appreciate that the ground electrode can be stationary and the Vin or Vout electrode can be moveable (using the processes described herein). In either scenario, contacts or wirings (to provide ground or signals) can be connected to the electrodes using conventional CMOS processes, as should be understood by those of skill in the art. These contacts or wirings, for example, can be formed through or extending from the piezoelectric substrate using photolithography, etching and deposition techniques well known to those of skill in the art.

FIG. 1 shows a beginning structure and respective fabrication processes for fabricating a SAW filter in accordance with aspects of the present invention. More specifically, FIG. 1 shows a beginning structure 5, which includes a substrate 10. In embodiments, the substrate 10 can be any insulator material or other type of substrate. A piezoelectric substrate 12 is formed on the substrate 10. In embodiments, the piezoelectric substrate 12 can be any type of piezoelectric material such as, for example, MN or ZnO.

As further shown in FIG. 1, an electrode (e.g., fingers of a single electrode) 14 and plurality of actuators 16 are formed on the piezoelectric substrate 12. In embodiments, the electrode 14 and actuators 16 are wiring structures formed by either an additive or subtractive process. For example, the actuators 16 can be formed by etching a trench into the piezoelectric substrate 12, using conventional lithographic and etching processes, e.g., forming a mask, exposing the mask to energy to form a pattern and then etching into the piezoelectric substrate 12 to form the trench. Thereafter, metal can be formed in the trenches by a conventional deposition process such as, for example, Atomic Layer Deposition (ALD) or Chemical Vapor Deposition (CVD) process. The piezoelectric substrate 12 can then undergo a conventional polishing process such as a chemical mechanical process (CMP). The actuator 16 can also be formed in a subtractive process, which would include a blanket deposition of metal, a patterning step using conventional photolithography and etching, and then a deposition of additional piezoelectric material with, for example, an optional planarization thereof.

The actuators 16 can also be formed on top of the piezoelectric substrate 12 with the electrode 14 using an additive or subtractive process. In this configuration, the electrode 14 would go through an additional process, in order to raise its height above the surface of the actuator 16. More specifically, the electrode 14 and actuators 16 can be formed by depositing a metal layer on the piezoelectric substrate 12, and patterning the metal layer using conventional lithographic and etching (e.g., reactive ion etching (RIE) processes. In any of the embodiments, the metal layer can be any conductive metal or alloy thereof. For example, the metal layer can be, for example, aluminum, gold or copper; although other metals are contemplated by the present invention. In embodiments, the electrode 14 is a Vin electrode (signal electrode) of a Vin IDT and the actuators 16 are a bottom electrode structured to electro-statically move a ground electrode of the Vin IDT. It should be understood by those of skill in the art, that the electrode 14 and the actuators 16 can also be associated with a Vout IDT.

FIG. 1 shows three actuators 16; however, it should be understood by those of skill in the art that the present invention is not limited to three actuators. For example, the number of actuators can match any number of fingers of a moveable electrode (e.g., ground electrode). Alternatively, the present invention contemplates using less than a corresponding number of fingers of a moveable electrode (e.g., ground electrode). It should also be understood that the fingers of the electrode 14 are in electrical communication with one another using a common wiring structure formed in the same manner and during the same processing flows as the fingers of the electrodes 14. (See, e.g., FIG. 7.)

In one non-limiting example, the electrode 14 and/or actuators 16 can be deposited on the substrate 12 to a depth of about 0.05 to 4 μm and preferably to a depth of 0.25 μm for the actuators 16; although other dimensions are also contemplated by the present invention. In embodiments, the electrode 14 and/or actuators 16 can be a refractory metal such as Ti, TiN, TiN, Ta, TaN, and W and the like, or AlCu, or a noble metal such as, for example, Au, Pt, Ru, Ir, and the like amongst other wiring materials. For example, in embodiments, electrode 14 and/or actuators 16 could be formed from pure refractory metals, or aluminum or an aluminum alloy such as AlCu, AlSi, or AlCuSi.

Figure 2:
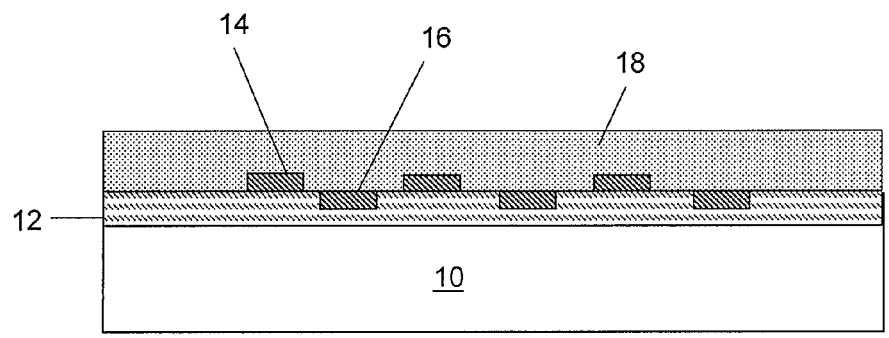

In FIG. 2, an insulator layer 18 is deposited over the electrode 14 and actuators 16, and exposed portions of the piezoelectric substrate 12. The insulator layer 18 can be any insulator layer such as, for example, an oxide based material ($SiO_2$) or other interlevel dielectric material known to those of skill in the art. The insulator layer 18 can be deposited using any conventional deposition process, e.g., chemical vapor deposition (CVD). For example, deposition options for the insulator layer 18 include one or more of plasma-enhanced CVD (PECVD), sub-atmospheric CVD (SACVD), atmospheric pressure CVD (APCVD), high density plasma CVD (HDPCVD), physical vapor deposition (PVD), or atomic layer deposition (ALD). In embodiments, the insulator layer 18 is deposited at temperatures compatible with metal wiring, e.g., aluminum wiring, e.g., under about 420° C. and preferably under about 400° C. In embodiments, the insulator layer 18 is deposited to a depth of about 80 nm; although other dimensions are also contemplated by the present invention.

Figure 3:
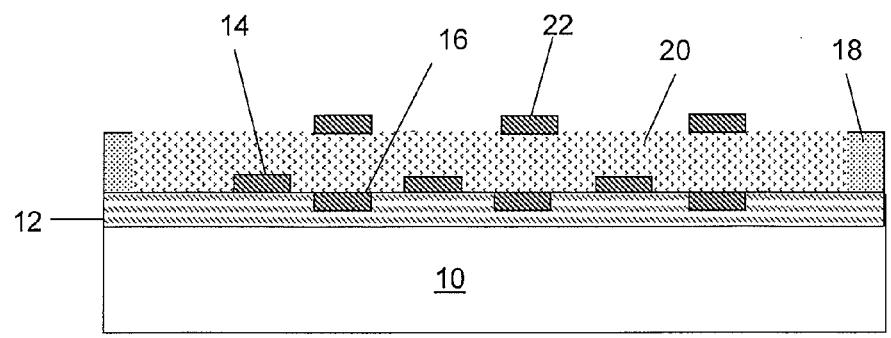

As shown in FIG. 3, in embodiments, the insulator layer 18 can be patterned using conventional lithographic and etching processes to form a pattern (e.g., opening). In embodiments, the opening is aligned with the electrode 14 and/or actuators 16. Also, the patterning will expose the electrode 14 and/or actuators 16. The opening is then filled with a sacrificial material 20 such as, for example, PMGI (polydimethylglutarimide polymer) or silicon. The sacrificial material 20 can be planarized by a chemical mechanical process (CMP), known to those of skill in the art.

FIG. 3 further shows the formation of a ground electrode 22. The ground electrode 22 of the present invention can be manufactured in a number of ways using a number of different tools. For example, in embodiments, the ground electrode 22 can be formed by an additive process or subtractive process. For example, in a subtractive process, a metal material is deposited on the sacrificial material 20, which is then patterned using conventional lithographic and etching (e.g., reactive ion etching (RIE)) processes. The metal can be any conductive metal or alloy thereof, e.g., aluminum, gold or copper; although other metals are contemplated by the present invention. In embodiments, the fingers of the ground electrode 22 will be positioned to be interleaved with the fingers of the electrode 14. Also, in embodiments, the ends of the fingers of the ground electrode 22 can be aligned with the actuators 16. Alternatively, the fingers of the ground electrode 22 can be aligned with any number of the actuators.

It should be understood by those of skill in the art that contacts or wirings (to provide ground or signals) can be connected to the electrodes and actuators using conventional CMOS processes, as should be understood by those of skill in the art. These contacts or wirings, for example, can be formed through or extending from the piezoelectric substrate 12 using photolithography, etching and deposition techniques well known to those of skill in the art. (See, e.g., FIG. 7.)

Figure 4:
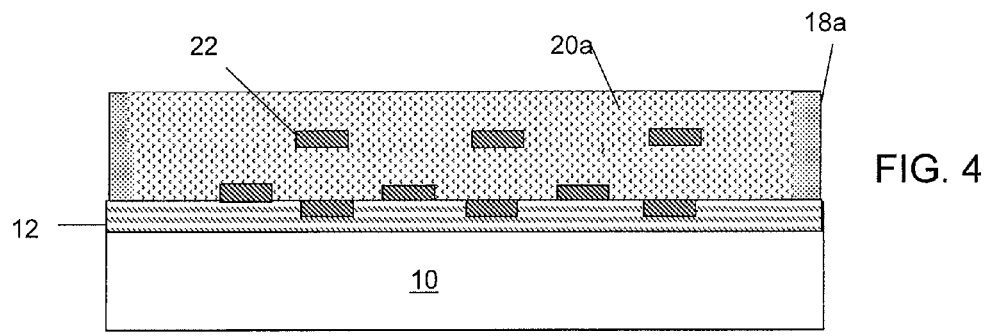

As shown in FIG. 4, an insulator layer 18a is formed on the sacrificial material 20 and over the fingers of the ground electrode 22. In embodiments, the insulator layer 18a can be any insulator layer as described with reference to layer 18. The insulator layer 18a is patterned to form an opening, using any conventional lithographic and etching process known to those of skill in the art. The patterning will result in an opening, exposing the fingers of the ground electrode 22. The opening is then filled with a sacrificial material 20a such as, for example, PMGI or silicon. In embodiments, the sacrificial material 20 and 20a are the same type of material, so that they can be vented in a same venting process. In alternate embodiments, the sacrificial material 20a can be formed and patterned, without the use of the insulator layer 18a.

Figure 5:
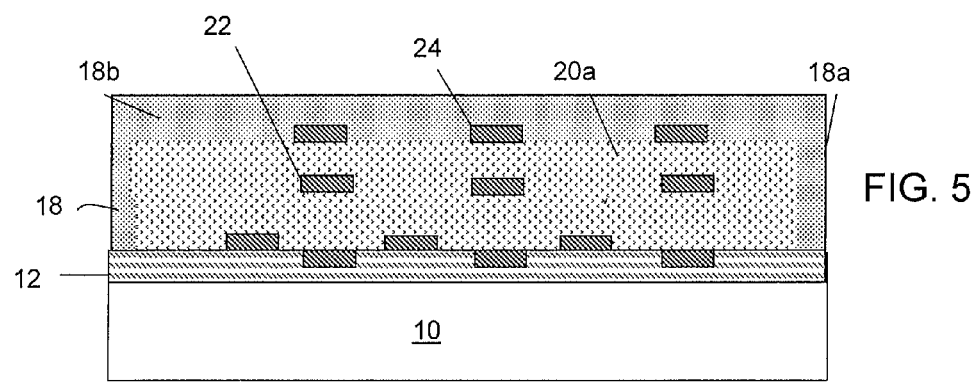

In FIG. 5, one or more actuators 24 are formed above the fingers of the ground electrode 22. The one or more actuators 24 can be formed by any conventional process, using any conventional metal or metal alloys as already discussed herein. For example, in embodiments, an insulator layer 18b can be formed (e.g., deposited) on the sacrificial material 20a, and patterned using conventional lithographic and etching processes. Metal can then be deposited in the pattern (e.g., opening) to form the one or more actuators 24. Additional insulator material (e.g., capping layer) 18b can then be deposited on the one or more actuators 24. Alternatively, the one or more actuators 24 can be formed by blanket deposition metal and patterning the metal using conventional CMOS processes. As with the actuators 16, the present invention also contemplates using less than three actuators 24 (e.g., less than a corresponding number of fingers of the ground electrode 22).

Figure 6:
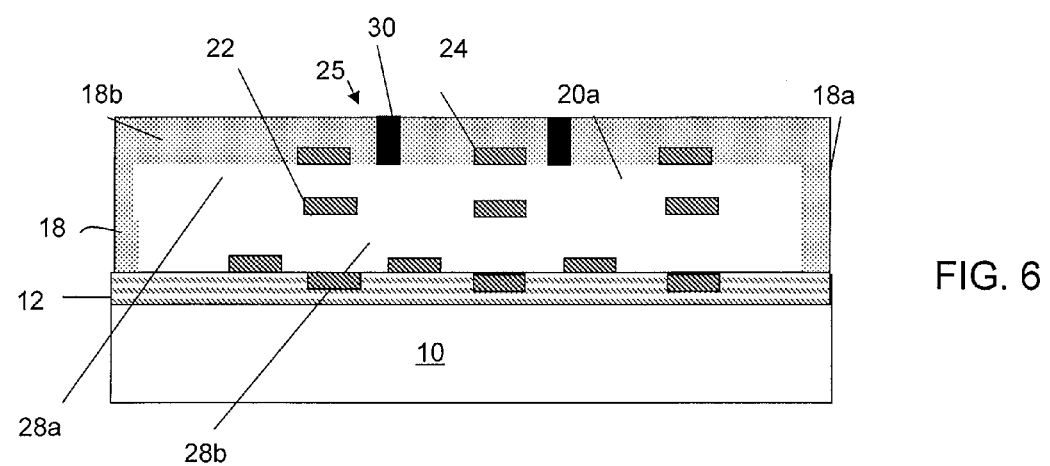

In FIG. 6, one or more vent holes 25 are patterned and opened in the insulator layer 18b, exposing a portion of the sacrificial material 20a. The vent hole 25 can be formed using conventional lithographic and etching processes known to those of skill in the art. The width and height of the vent hole 25 determines the amount of material that should be deposited after venting to pinch off the vent hole 25. The vent hole 25 may be circular or nearly circular to minimize the amount of subsequent material needed to pinch it off.

Still referring to FIG. 6, the sacrificial material is vented or stripped by way of the vent hole 25. In embodiments, the stripping (e.g., etching) can be performed using an etchant that is selective to removing of the sacrificial material through the vent hole 25, e.g., $XeF_2$. The etching will strip all of the sacrificial material, thereby forming an upper cavity or chamber 28a and a lower cavity or chamber 28b. The vent hole 25 can then be sealed with material 30, such as a dielectric or metal. To avoid an issue of sealing material entering the cavity and depositing on any structure (e.g., electrodes and/or actuators), in embodiments, the vent holes 25 can be strategically placed away from the structures.

Figure 7:
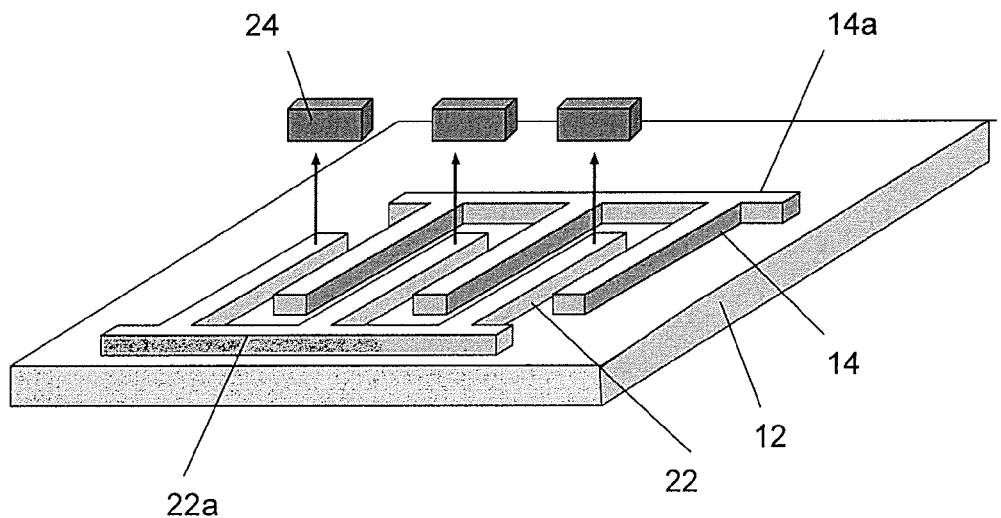
FIG. 7 shows a perspective exploded view of the switchable filter of FIG. 6, in an actuated state, in accordance with aspects of the present invention.

FIG. 7 shows a perspective exploded view (without the insulator material shown) of the filter structure of FIG. 6, in accordance with aspects of the present invention. As shown in FIG. 7, in the actuated state (e.g., "on" state), the plurality of fingers of the ground electrode 22 are interleaved with the fingers of the electrode 14 for either the Vin IDT or Vout IDT. More specifically, in the actuated state, e.g., pull-in position, the ground electrode 22 is in the same plane as the electrode 14. The ground electrode 22 can be pulled in (e.g., electrostatically moved) by application of a drive voltage to, for example, the actuator 16 (not shown) (attractive force (voltage positive)) or the actuator 24 (repulsive force (negative voltage)). It should be understood that this same design can be used for either moving the Vin IDT or Vout IDT. FIG. 7 also shows the wiring structure 14a that connects the fingers of the electrode 14, and the wiring structure 22a that connects the fingers of the ground electrode 22.

As thus shown in FIG. 7, and as should now be understood by those of skill in the art, the moveable ground electrode can move into the same plane as the Vin electrode (or Vout electrode) to contact the substrate 12 and to allow a signal (voltage) to pass between the ground electrode 22 and the electrode 14 of the Vin IDT or Vout IDT, depending on the configuration of the structure. By being in the same plane, a wave can be propagated along the piezoelectric substrate from the Vin IDT to the Vout IDT, where it will be converted back into a signal.

Figure 8:
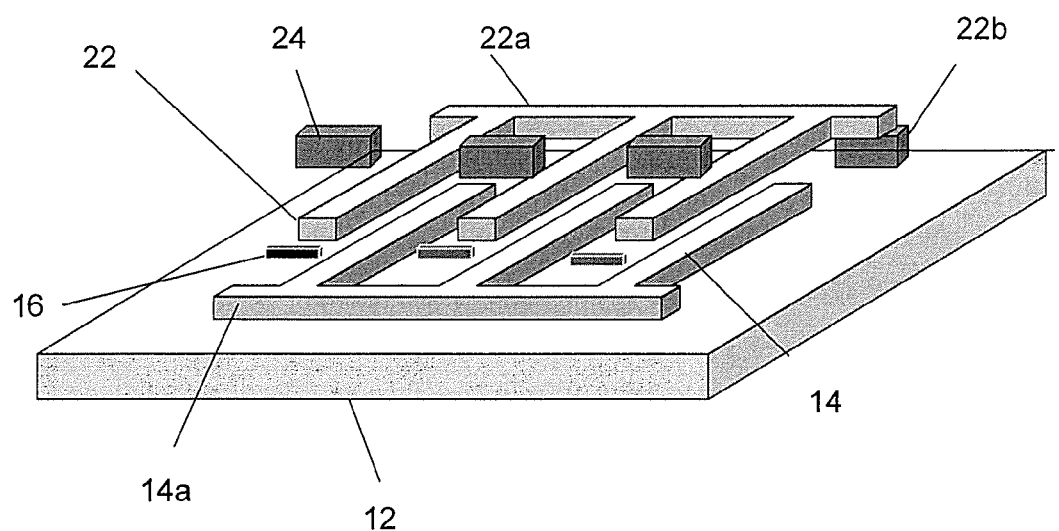
FIG. 8 shows a perspective exploded view of the switchable filter of FIG. 6, in a non-actuated state, in accordance with aspects of the present invention.

FIG. 8 shows a perspective exploded view (without the insulator material shown) of the filter structure of FIG. 6, in a non-actuated state, in accordance with aspects of the present invention. FIG. 8 also shows a contact 22b, for the moveable electrode (e.g., ground electrode 22). The contact 22b provides an electrical contact to the moveable electrode, e.g., ground or signal. The contact 22b can be formed of any of the same materials that form any of the electrodes 14, 22 or actuators 16, 24, as described herein. The contact 22b can also be formed using conventional CMOS processes, known to those of skill in the art, e.g., photolithography, etching and/or deposition of material.

As shown in FIG. 8, in the non-actuated state (e.g., "off" state), the plurality of fingers of the ground electrode 22 are no longer in a same plane as the fingers of the electrode 14 for either the Vin IDT or Vout IDT. More specifically, in the non-actuated state, e.g., up position, ground electrode 22 can be placed into it natural state above the electrode 14, by not applying a drive voltage to the actuators 16 or 24.

In embodiments, though, it is contemplated that the natural state of the ground electrode 22 is in a down position, e.g., "on" position, substantially in the same plane as the electrode 14. This can be accomplished by fabricating the actuators 16 in the substrate 12, and the ground electrode 22 substantially on the substrate 12 (on a very thin layer of sacrificial material) so that the fingers of the ground electrode 22 can be interleaved with the fingers of the electrode 14, and also contact with the substrate 12 when the filter is activated. It should also be understood by those of skill in the art that the actuators 16 are aligned with an end portion for the ground electrodes 22 in order to provide a pull-in force, and this alignment will also allow the ground electrodes 22 to contact the substrate 12 upon activation. In this embodiment, to turn off the filter, a drive voltage can be applied to the actuators to pull up the ground electrode 22. For example, the ground electrode 22 can be pulled up (e.g., electro-statically move) by application of a drive voltage to, for example, the actuator 16 (not shown) (repulsive force (negative positive)) or the actuator 24 (attractive force (positive voltage)). It should be understood that this same design can be used for moving either the Vin IDT or Vout IDT.

In operation, it is possible to determine a frequency of a filter, e.g., SAW filter, and based on the frequency or the need to have the filter activated, electro-statically move a moveable electrode (e.g., ground electrode 22 or signal electrode 14) of the filter by applying a drive voltage to at least one actuator in order activate or deactivate the filter.

Figure 9:
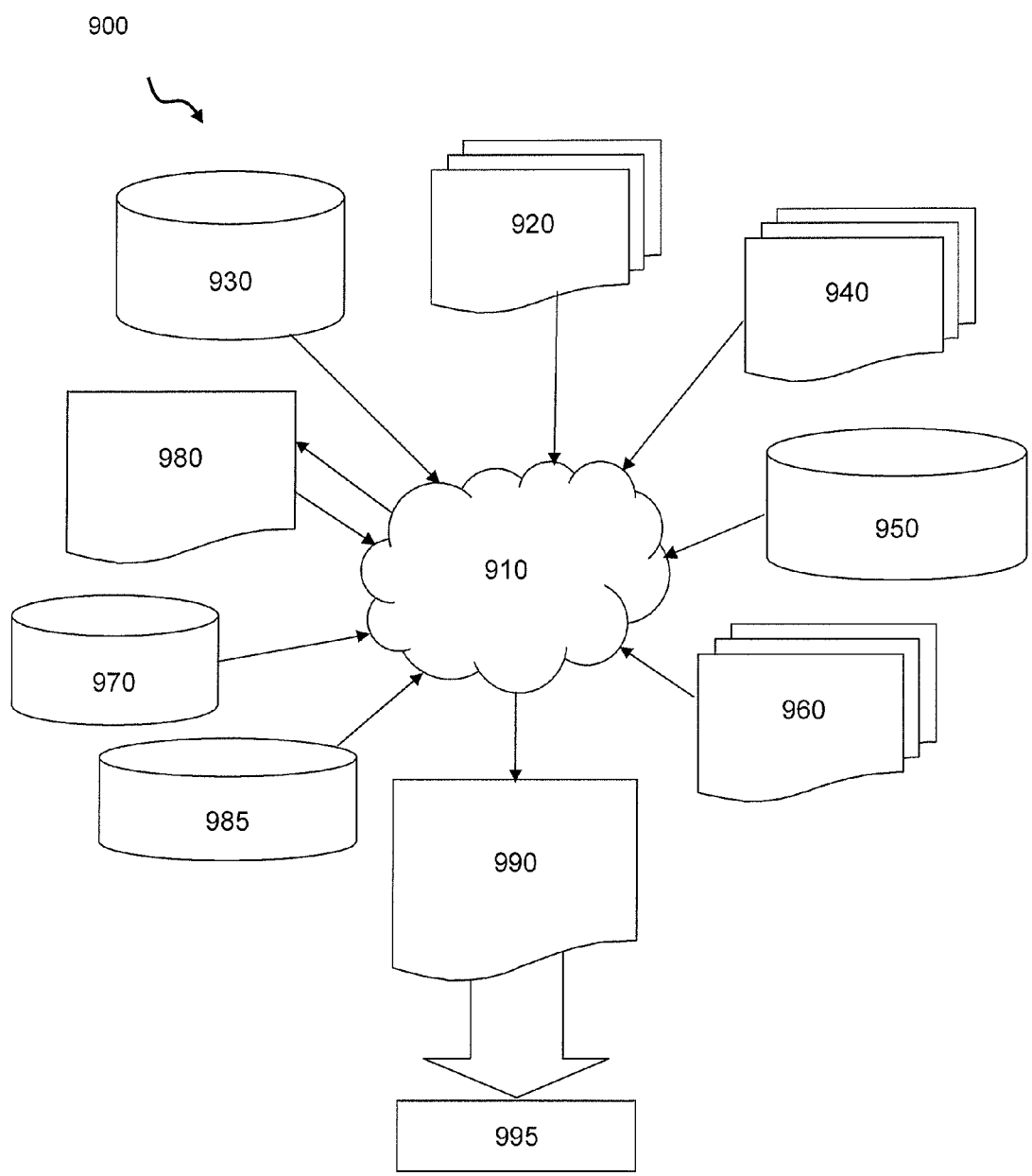
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: photolithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-8 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 990 may comprise a compiled, executable HDL simulation model that functionally simulates the devices shown in FIGS. 1-8.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   forming at least one piezoelectric filter structure comprising a plurality of electrodes formed on a piezoelectric substrate, comprising:
   forming a fixed electrode with a plurality of fingers on the piezoelectric substrate;
   forming a moveable electrode with a plurality of fingers over the piezoelectric substrate; and
   forming actuators aligned with one or more of the plurality of fingers of the moveable electrode,
   wherein forming the actuators comprises etching a trench in the piezoelectric substrate and depositing a metal or metal alloy in the trench.

2. The method of claim 1, wherein the moveable electrode is formed as a ground electrode, which, upon actuation, the plurality of fingers of the moveable electrode become interleaved with the plurality of fingers of the fixed electrode.

3. The method of claim 1, wherein the moveable electrode is formed as a Vin electrode, which, upon actuation, the plurality of fingers of the Vin electrode become interleaved with the plurality of fingers of the ground electrode.

4. The method of claim 1, wherein forming the actuators comprises aligning the actuators with the plurality of fingers of the moveable electrode.

5. The method of claim 1, wherein forming the actuators comprises forming less than a number of the plurality of fingers of the moveable electrode.

6. The method of claim 1, wherein the at least one piezoelectric filter structure is a surface acoustic wave (SAW) filter.

7. The method of claim 6, wherein forming the SAW filter comprises:
   forming a Vin interdigital transducer (IDT) comprising interleaved signal and ground electrodes; and
   forming a Vout IDT comprising interleaved signal and ground electrodes.

8. The method of claim 7, wherein forming the moveable electrode comprises positioning the moveable electrode above the signal electrode of the Vin IDT or the Vout IDT.

9. The method of claim 7, wherein forming the moveable electrode comprises positioning the moveable electrode above a ground electrode of the Vin IDT or the Vout IDT.

10. The method of claim 1, wherein the actuators are formed above and below the moveable electrode.

11. The method of claim 1, wherein the plurality of fingers of the moveable electrode are connected together with a single wiring structure on a same plane.

12. The method of claim 11, wherein the plurality of fingers of the fixed electrode are connected together with a single wiring structure on a same plane.

13. The method of claim 12, wherein the moveable electrode with the plurality of fingers and the fixed electrode with the plurality of fingers are formed such that in a pull-in position, the plurality of fingers of the fixed electrode and the plurality of fingers of the moveable electrode are in a same plane.

14. The method of claim 13, wherein the actuators aligned with one or more of the plurality of fingers of the moveable electrode are formed below each of the plurality of fingers of the moveable electrode on the piezoelectric substrate.

15. A method comprising:
forming at least one piezoelectric filter structure comprising a plurality of electrodes formed on a piezoelectric substrate, comprising:
forming a fixed electrode with a plurality of fingers on the piezoelectric substrate;
forming a moveable electrode with a plurality of fingers over the piezoelectric substrate; and
forming actuators aligned with one or more of the plurality of fingers of the moveable electrode,
wherein forming the moveable electrode comprises:
forming an insulator layer over the fixed electrode and the actuators;
patterning the insulator layer to expose the fixed electrode;
depositing a sacrificial material in the pattern of the insulator layer and over the fixed electrode;
forming the moveable electrode on the sacrificial material, which is positioned to have its plurality of fingers interleaved with the plurality of fingers of the fixed electrode;
forming an additional sacrificial material over the moveable electrode;
forming at least one actuator over the additional sacrificial material and in alignment with at least one of the plurality of fingers of the moveable electrode;
forming a capping layer over the additional sacrificial material;
forming at least one vent hole in the capping layer;
venting the sacrificial material and the additional sacrificial material through the at least one vent hole to form an upper cavity and a lower cavity about the moveable electrode; and
closing the at least one vent hole with material.

16. The method of claim 15, wherein forming the additional sacrificial material comprises:
depositing an insulator material on the sacrificial material;
patterning the insulator material; and
depositing the additional sacrificial material within the pattern of the insulator material.

17. The method of claim 15, wherein forming the additional sacrificial material comprises:
depositing the additional sacrificial material on the sacrificial material; and
patterning the additional sacrificial material.

18. A method comprising:
forming at least one piezoelectric filter structure comprising a plurality of electrodes formed on a piezoelectric substrate, comprising:
forming a fixed electrode with a plurality of fingers on the piezoelectric substrate;
forming a moveable electrode with a plurality of fingers over the piezoelectric substrate;
forming actuators aligned with one or more of the plurality of fingers of the moveable electrode; and
forming the actuators aligned with the one or more of the plurality of fingers of the moveable electrode in a dielectric material above the moveable electrode, and the moveable electrode with the plurality of fingers are within in a chamber formed by venting of sacrificial material between the piezoelectric substrate and the dielectric material.

* * * * *